United States Patent
Mozak et al.

(10) Patent No.: US 12,321,214 B2
(45) Date of Patent: Jun. 3, 2025

(54) FAST SELF-REFRESH EXIT POWER STATE

(71) Applicant: Intel Corporation, Santa Clara, CA (US)

(72) Inventors: Christopher P. Mozak, Portland, OR (US); Robert J. Royer, Jr., Portland, OR (US); Aaron Martin, El Dorado Hills, CA (US); Alex P. Thomas, El Dorado Hills, CA (US); Tomer Levy, Tel Aviv (IL); Noam Lupovich, Pardesiya (IL)

(73) Assignee: Intel Corporation, Santa Clara, CA (US)

( * ) Notice: Subject to any disclaimer, the term of this patent is extended or adjusted under 35 U.S.C. 154(b) by 633 days.

(21) Appl. No.: 17/561,651

(22) Filed: Dec. 23, 2021

(65) Prior Publication Data
US 2022/0121263 A1    Apr. 21, 2022

(51) Int. Cl.
  *G06F 1/32*    (2019.01)
  *G06F 1/3234*    (2019.01)
  *G06F 1/3237*    (2019.01)

(52) U.S. Cl.
  CPC .......... *G06F 1/3237* (2013.01); *G06F 1/3275* (2013.01)

(58) Field of Classification Search
  None
  See application file for complete search history.

(56) References Cited

U.S. PATENT DOCUMENTS

| 8,811,105 B2 | 8/2014 | Fujisawa |
| 9,224,451 B2 | 12/2015 | Fujisawa |
| 9,570,119 B2 | 2/2017 | Fujisawa |
| 2014/0032947 A1 | 1/2014 | Ahmad et al. |
| 2016/0350002 A1 | 12/2016 | Vergis et al. |
| 2020/0177194 A1* | 6/2020 | Aouini ............ H03L 7/22 |
| 2021/0191737 A1* | 6/2021 | Raheja ............ G06F 1/3228 |

FOREIGN PATENT DOCUMENTS

WO    2012021380 A2    2/2012

OTHER PUBLICATIONS

Extended European Search Report for Patent Application No. 22208942.7, Mailed May 2, 2023, 20 pages.

* cited by examiner

*Primary Examiner* — Keshab R Pandey
(74) *Attorney, Agent, or Firm* — Compass IP Law PC

(57) ABSTRACT

In a memory subsystem, a memory controller can put its physical interface (PHY) into a low power state when an associated memory device is in self-refresh. Instead of powering on the interface and then triggering the memory device to exit self-refresh, or instead waiting for the physical interface to be powered up prior to waking the memory device from self-refresh, the memory controller can instruct the PHY to send a self-refresh exit command to the memory device and power up the physical interface in parallel with the memory device coming out of self-refresh. The memory controller can power down a high speed clock path of the PHY and use a slower clock path to send the self-refresh exit command before powering the high speed clock path back up.

23 Claims, 7 Drawing Sheets

FAST SELF-REFRESH EXIT POWER STATE

FIELD

Descriptions are generally related to memory, and more particular descriptions are related to a memory device exiting self-refresh.

BACKGROUND

Memory subsystem power has a significant impact in computer system battery life. Traditionally, computer systems have different memory subsystem power management states. With the different power management states, power usage tends to be inversely proportional to transition time from low power state to active state. For example, a system with 4 different states could be (1) active idle power, (2) memory power down (analog clock components powered down), (3) memory self-refresh, and (4) low power state (PLL (phase locked loop) and voltage rails powered down). Examples of power usage and wake time or "exit latency" can be as follows, with the power values normalized to the power of (1) active idle power: (1) N mW (milliwatts) power with 7.5 ns (nanosecond) exit latency, (2) 0.56N mW power with 30 ns exit latency, (3) 0.53N mW power with 300 ns exit latency, and (4) 0.14N mW power with 10 us (microsecond) exit latency. It will be understood that the 300 ns exit latency for self-refresh is largely defined by the memory device self-refresh exit latency specification, rather than by system or controller power management.

It will be understood that the power states refer to the power of the host SOC (system on a chip), and do not necessarily factor memory power saving. It can be observed that self-refresh and power down have similar power saving, but significantly different exit latencies. While self-refresh can also save memory power, the latency is an order of magnitude greater than the power down state. Additionally, while the lowest power state would obviously save more power, the exit latency is too great for many workloads to use effectively, as the latency would have a noticeable performance impact and poor user experience.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
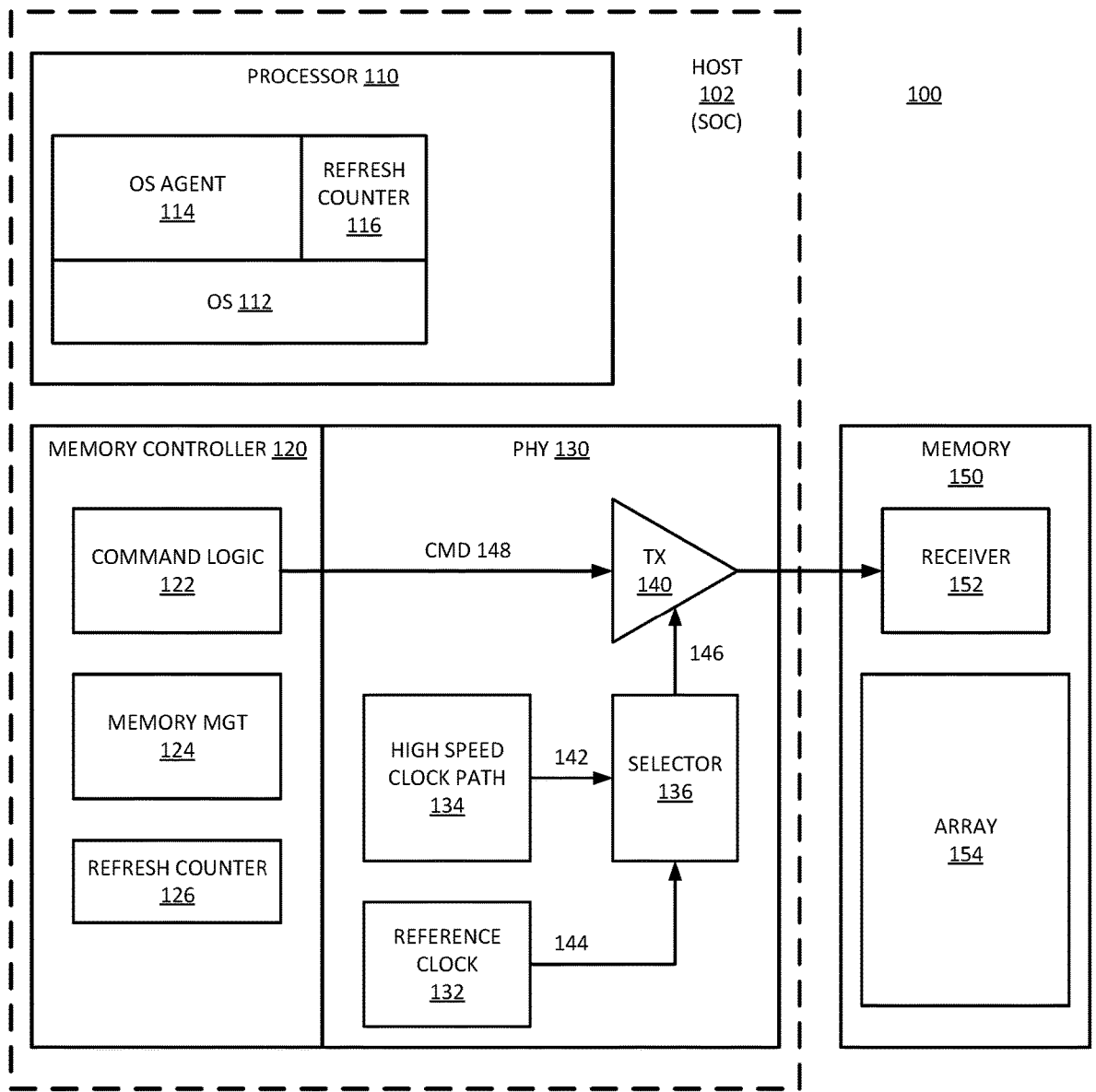
FIG. 1 is a block diagram of an example of a system with a physical interface that powers up in parallel with a memory exiting from self-refresh.

Descriptions of certain details and implementations follow, including non-limiting descriptions of the figures, which may depict some or all examples, and well as other potential implementations.

DETAILED DESCRIPTION

As described herein, a memory subsystem, a memory controller can put its physical interface (PHY) into a low power state when an associated memory device is in self-refresh. Instead of powering on the interface and then triggering the memory device to exit self-refresh, or instead waiting for the physical interface to be powered up prior to waking the memory device from self-refresh, the memory controller can instruct the PHY to send a self-refresh exit command to the memory device and power up the physical interface in conjunction with or in parallel with the memory device coming out of self-refresh. The memory controller can power down a high speed clock path of the PHY and use a slower clock path to send the self-refresh exit command before powering the high speed clock path back up.

As identified above, one approach to power management includes four states having power and exit latency as follows, with the power values normalized to the power of (1) active idle power: (1) active idle power at N mW (milliwatts) power and 7.5 ns (nanosecond) exit latency, (2) memory power down at 0.56N mW power and 30 ns exit latency, (3) memory self-refresh at 0.53N mW power and 300 ns exit latency, and (4) low power state at 0.14N mW power and 10 us (microsecond) exit latency. Turning off the high speed clock path when the memory device is in self-refresh, and then bringing the physical interface back up while the memory device is coming out of self-refresh can effectively provide a fifth power management state for a computer system.

Such a fifth power management state can be considered: (5) low power self-refresh (memory device in self-refresh, and PHY clock powered down) with a power on the order of approximately 0.14N mW and an exit latency of approximately 330 ns, which is governed by a DRAM (dynamic read only memory) specification standard. When compared to the traditional self-refresh state, there is a comparable exit latency with a power reduction of nearly 3.5×. When compared with the traditional low power state, there is a comparable power savings with an exit latency reduction of approximately 30× with design optimization.

By powering up the physical interface circuitry in parallel with the memory device, the power management can put at least a portion of the host wakeup latency in parallel with the memory wakeup latency. Instead of waiting to wake up the memory device until the host interface circuitry is fully powered up, the system can send a self-refresh exit command before the host hardware is fully powered up, or before initiating power-up of the host hardware. Thus, instead of serially powering up the host interface and then the memory device, the host interface and the memory device can power up at the same time.

In one example, the system parallelizes the flow of host power up and DRAM exit from self-refresh. For such parallel operation, the memory controller or the host can maintain a slower clock available to send the self-refresh exit (SRX) command to the memory device. The host can send the clock reference as the clock for the memory device, enabling the memory device to receive the command based on the slower clock before the faster clock of the normal interface path is fully powered up. Once the faster clock becomes available, the host can switch clock frequencies for the sending of commands. Reference to a slower clock is merely one example. In one example, the reference clock has the same frequency as the high speed clock signal.

Reference to memory device can refer to one or more DRAM (dynamic random access memory) devices coupled to the physical interface of the memory controller. In one example, the memory devices are low power DRAM (LP DRAM) devices.

FIG. 1 is a block diagram of an example of a system with a physical interface that powers up in parallel with a memory exiting from self-refresh. System 100 includes host 102, which represents the host hardware platform to which memory 150 is coupled. In one example, host 102 represents a system on a chip (SOC), which includes at least a host processor and memory controller circuit.

Processor 110 represents the host processor. Processor 110 can be or include a single core or multicore processor. In one example, processor 110 represents a CPU (central processing unit). In one example, processor 110 represents a GPU (graphics processing unit). Processor 110 executes OS (operating system) 112, which provides a software platform to execute programs that will generate requests for memory access. OS (operating system) agent 114 represents a program or service that operates on OS 112.

Memory controller 120 represents a controller to manage access to memory 150. Memory 150 can be or include one or multiple memory devices. In one example, memory 150 includes LPDDR (low power double data rate) DRAM devices. In one example, memory 150 includes DDR (double data rate) DRAM devices. In one example, memory 150 includes HBM (high bandwidth memory or stacked memory) DRAM devices. In one example, memory controller 120 is part of processor 110, such as an integrated memory controller circuit. Memory 150 includes array 154, which represents one or more arrays of memory cells or bitcells. Array 154 is arranged as rows of memory.

Memory controller 120 includes command logic 122 to generate memory access commands. The memory access commands can include read and write commands in response to requests from applications executing within or under OS 112. The memory access commands can include a self-refresh entry (SRE) command and a self-refresh exit (SRX) command. The SRE command refers to a command that triggers memory 150 to enter self-refresh. The SRX command refers to a command that triggers a memory device in self-refresh to exit the self-refresh state. Self-refresh is used as an example of a low power state to which the high speed clock powerdown can apply. The powering down of the high speed clock path with subsequent powering up of the clock path in parallel with the exiting of the memory from low power state can also be applied to other low power states.

Host 102 includes PHY (physical interface) 130. PHY 130 represents hardware interface components to drive command and address information to memory 150 to send the commands generated by command logic 122. In one example, PHY 130 represents a memory interface compatible with DFI (DDR (double data rate) PHY interface). PHY 130 can be referred to as a memory controller physical interface to couple to memory 150.

In one example, PHY 130 includes reference clock 132, high speed clock path 134, and transmitter (TX) 140. Reference clock 132 represents a clock signal in host 102 that is slower than the clock signal for high speed communication with memory 150. In one example, reference clock 132 is a reference clock used to generate the high speed clock. High speed clock path 134 represents hardware components that generate a high speed clock for communication with memory 150. Transmitter 140 represents transmitter hardware to drive command signal lines to memory 150. Transmitter 140 transmits commands to memory 150.

System 100 illustrates command (CMD) 148 generated by command logic 122, to be driven to memory 150 by transmitter 140. Transmitter 140 is controlled by a clock signal, to control the driving of the command signal, as well as providing the command signal to memory 150 as a timing signal to clock the receiver hardware of memory 150, represented as receiver 152.

Signal 142 represents a high speed clock signal generated by high speed clock path 134. Signal 142 is the typical clock signal to use to transmit commands to memory 150. Signal 144 represents a bypass path of the high speed clock path. Signal 144 represents a reference clock path and provides the reference clock as an option to clock transmitter 140.

Selector 136 represents selection hardware in PHY 130 to control selection between signal 142 and signal 144 for sending command 148. Signal 146 represents the selected signal, and is the signal that triggers transmitter 140, and which is sent to memory 150 as a receiver reference signal. In one example, selector 136 is triggered based on a power state of high speed clock path 134. In one example, when high speed clock path 134 is powered down, selector 136 selects signal 144. When high speed clock path 134 is powered up, selector 136 can select signal 142.

Signal 144 as a bypass path enables the system to implement the parallelization. In system 100, command signal 148 can bypass a typical data path when selector 136 selects signal 144 instead of signal 142 as the clock. The bypassing can allow the command signals to bypass a datapath that can be powered off while memory 150 is in self-refresh.

It will be understood that high speed clock path 134 consumes a significant amount of power. By powering down high speed clock path 134 (which can include powering down PLLs (phase locked loops) and DLLs (delay locked loops)), system 100 can save significant power during self-refresh, but will have a significant amount of interface circuitry that need to be powered up before high speed communication can resume. For example, system 100 can power down internal SOC power rails and clocks in PHY 130 that are responsible for high speed communication with memory 150, and then power them up in parallel with memory 150 waking from self-refresh.

Unlike high speed clock path 134, which gets shut off, reference clock 132 and its bypass clock path can stay on while memory 150 is in self-refresh. The phase adjustment circuitry of high speed clock path 134 tends to consume most of the power; without such circuitry, reference clock 132 can stay on without consuming significant power. In a case where reference clock 132 is lower frequency, the power can be proportionally lower due to the lower frequency.

It will be understood that in self-refresh, memory 150 manages refresh of the rows of array 154. Memory controller 120 manages refresh in normal operation of memory 150.

Memory management (MGT) 124 represents logic in memory controller 120 to manage the refresh of rows of array 154. When memory 150 enters self-refresh and then when memory 150 exits self-refresh, there will be a handoff between memory management 124 and memory 150. Such a handoff can be standards-based, based on the timing of when memory controller 120 sends commands to memory 150.

For parallel self-refresh exit and PHY power up, memory controller 120 through memory management 124 can account for the different wakeup timing. The timing will be different, because memory controller 120 may not be fully powered up while the memory device hands off refresh control and begins exit from self-refresh. In one example, memory controller 120 will keep track of the timing.

In one example, memory controller 120 includes refresh counter 126, which represents a counter or timer to manage the timing for the fast exit or parallel exit. In one example, memory controller 120 simply generates extra refreshes to send to memory 150 for self-refresh exit. In one example, memory controller 120 bases the number of extra refreshes on refresh counter 126, for example, based on the timing between sending the SRX command and when memory 150 indicates it has completed exit from self-refresh.

In one example, OS agent 114 includes refresh counter 116, which can track the need for memory refreshes. Memory controller 120 can indicate to OS 112 when it sends the SRX command to memory 150, and then proceed with powering up PHY 130. Refresh counter 116 can then track the time it takes for memory 150 to come online, and indicate the time to memory controller 120 to issue extra refreshes. The time can be tracked from transmission of the SRX command to receipt of an indication from the memory device that it has exited self-refresh.

Figure 2:
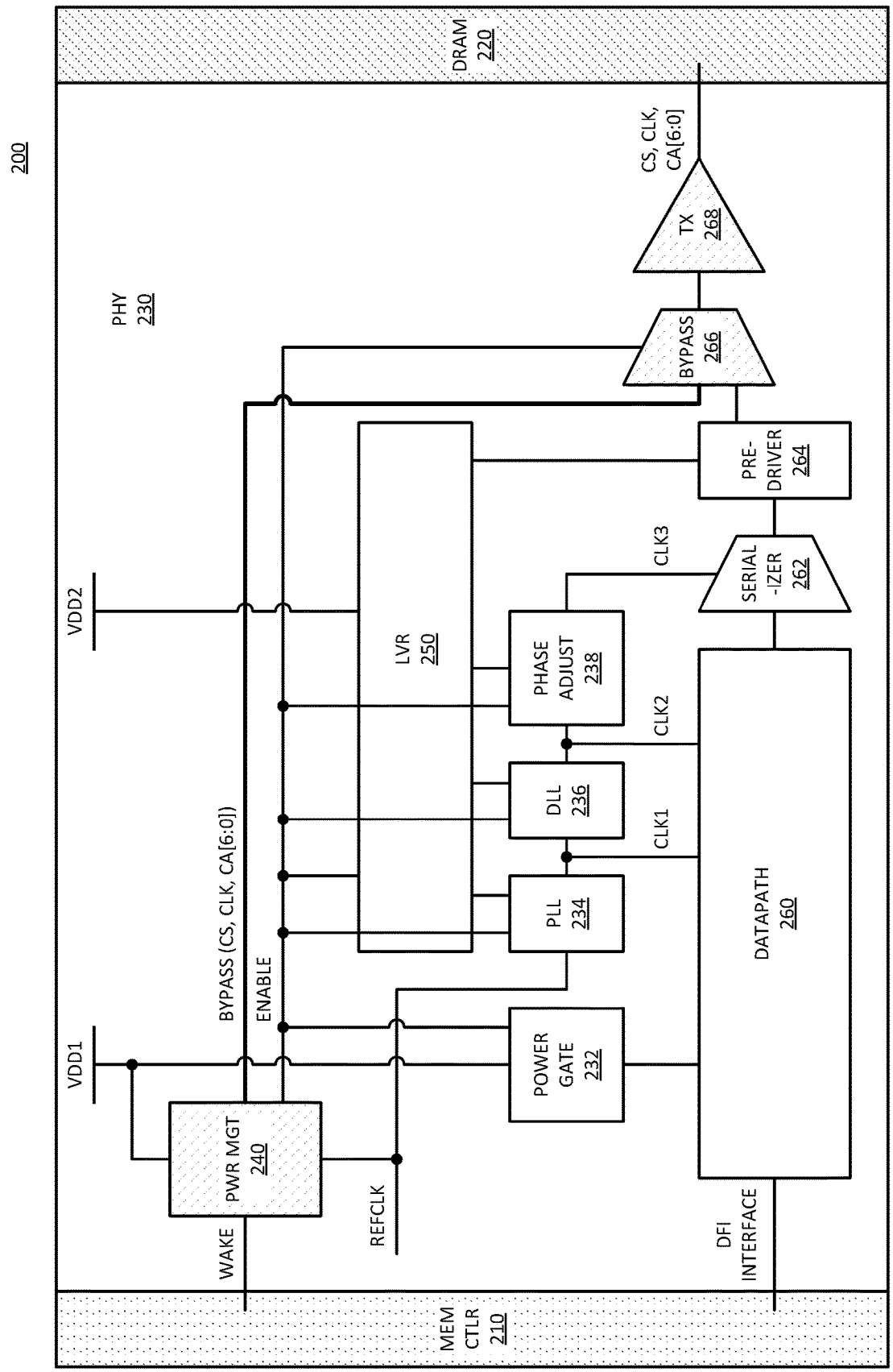
FIG. 2 is a block diagram of an example of a system in which the host interface and memory device wake up in parallel.

FIG. 2 is a block diagram of an example of a system in which the host interface and memory device wake up in parallel. System 200 represents a system in accordance with an example of system 100. PHY 230 represents a physical interface that couples DRAM (dynamic random access memory) 220 to memory controller (MEM CTRL) 210.

PHY 230 illustrates datapath 260, which is the DFI interface path. When memory controller 210 generates a command for DRAM 220 during normal operation, it will pass through datapath 260. Datapath 260 represents a hardware datapath that prepares the command and address signals for transmission to DRAM 220. In one example, datapath 260 can be referred to as a high speed datapath, where PHY 230 includes a bypass datapath that is a lower speed datapath to provide the command and the clock for the command. Datapath 260 is the high speed clock path for PHY 230, which generates a high speed clock signal and conditions data with that signal for high speed transmission to DRAM 220. Power gate 232 represents a power gate to control the power state of the typical high speed clock path. Power gate 232 can disable datapath 260 for low power state, such as when DRAM 220 is in self-refresh.

PLL (phase locked loop) 234 represents circuitry to generate the high speed clock for the clock and command signals through datapath 260. In one example, PLL 234 receives a reference clock represented as REFCLK. In one example, REFCLK can be a lower speed clock input that PHY 230 uses to generate a high speed clock signal. In one example, REFCLK is a reference clock signal for PLL 234. In one example, REFCLK is used as a slower clock to bypass the high speed clock path along datapath 260. In one example, REFCLK is used along the high speed clock path, and a different reference clock is used as a bypass source.

Use of a reference clock for the bypass refers to use of a clock signal as it is received in PHY 230, without needing hardware components that will consume significant amounts of power to condition the clock for use within PHY 230. Other implementations can generate the reference clock internal to the PHY. Thus, the reference clock can be used in the bypass path as it is received in PHY 230. The reference clock used could be REFCLK or another reference clock not specifically illustrated.

In one example, PLL 234 generates CLK1, which is a first generated clock signal along datapath 260. PLL 234 can provide CLK1 to datapath 260 and to DLL (delay locked loop) 236. DLL 236 represents timing control circuitry for the clock and command signals through datapath 260. DLL 236 can generate CLK2, which is a second generated clock signal. DLL 236 can provide CLK2 to phase adjust 238 and to datapath 260. While not specifically illustrated, in one example, PHY 230 includes a frequency locked loop (FLL) or other phase generation circuit in the high speed clock path or in the datapath.

Phase adjust 238 represents circuitry to manage the final clock signal. Phase adjust 238 can be referred to as a phase interpolator or P1. Phase adjust 238 can generate CLK3, which is a third generated clock signal. Phase adjust 238 can provide CLK3 as a control signal for serializer 262, which can receive the command signals from datapath 260. In some implementations, serializer 262 can take parallel bits and generate a serial stream that is controlled for phase and delay.

The combination of PLL 234, DLL 236, and phase adjust 238 can represent frequency and phase hardware that generates a high speed clock signal. Different implementations of PHY 230 will have different combinations of frequency and phase hardware, some of which can be different from what is illustrated. In general the frequency and phase hardware receives a reference signal and generates a stable, low jitter clock having a higher speed than the reference signal.

Predriver 264 represents circuitry to prepare the command signals and clock for transmission. TX 268 represents a transmitter to transmit the command signals to DRAM 220. The signals can include a chip select (CS) signal, the clock (CLK) signal, and command and address (CA[6:0]) signals. It will be understood that while the CA signals are illustrated as having 7 bits, other implementations can vary.

In one example, PHY 230 includes bypass 266 between predriver 264 and TX 268. Bypass 266 can operate as a selector between the high speed signals along datapath 260 and bypass signals. In one example, when the high speed clock path is disabled, bypass 266 can select the bypass path to use a slower speed clock signal path. Thus, bypass 266 can control selection of what signal is provided to TX 268 and transmitted to DRAM 220. As illustrated, bypass 266 can be implemented as a multiplexer or a mux. Bypass 266 may also convert between the logic on power gate 232 or LVR 250 voltage domains and a voltage domain for the reference clock or TX 268, which remains on during self-refresh.

In one example, PHY 230 includes LVR 250, which represents one or more low voltage regulators. LVR 250 can be implemented as a feedback loop; thus, with narrower bandwidth it will be more stable, with less oscillation. LVR 250 can provide control signals or reference signals for PLL 234, DLL 236, and phase adjust 238. LVR 250 or other voltage regulation can be used to create a low noise power supply, enabling higher I/O frequencies than would be possible with a noisy supply. System 200 illustrates LVR 250 receiving a high voltage reference signal (VDD2) as an input. LVR 250 can operate based on VDD2, which can be an ungated power supply. In one example, LVR 250 provides a control signal or reference signal to predriver 264.

PHY 230 includes power management (PWR MGT) 240. Power management 240 represents circuitry to control the power use of the circuitry in PHY 230. In one example, power management 240 receives a high voltage reference signal (VDD1) as an input. Power management 240 can operate based on VDD1, which can be an ungated power supply. In one example, power management 240 generates an enable signal based on a wake signal (WAKE) received from memory controller 210.

In one example, when memory controller 210 generates a self-refresh entry (SRE) signal for DRAM 220, it deasserts the wake signal, triggering power management 240 to deassert its enable signal output. In PHY 230, power management 240 generates an enable signal to control the state of power gate 232, PLL 234, DLL 236, phase adjust 238, and LVR 250. When deasserted, these components can be powered down, resulting in a low power state for PHY 230. Based on the deasserted signals, datapath 260, serializer 262, and predriver 264 will also be inactive. In one example, datapath 260 is powered down when the memory device is in self-refresh, and can be powered back up in parallel with the memory exiting self-refresh, as with the high speed clock path. With the enable signal asserted all of these components can be enabled.

In the low power mode when the enable is deasserted, power management 240, bypass 266, and TX 268 can remain active or remain powered up. Thus, these components can provide the low speed bypass path to enable sending a command to DRAM 220 before waking PHY 230. In one example, power management 240 provides bypass signals including CS, CLK, and CA[6:0], which would normally be provided through the high speed clock path of datapath 260.

In one example, the selection control of bypass 266 is triggered by the enable signal from power management 240. Thus, when the enable signal is asserted, bypass 266 can select the high speed clock path, and can select the low speed clock path, the bypass path, when enable is deasserted. In one example, the bypass path operates off of REFCLK when PHY 230 is in low power. The bypass path can be referred to as a reference clock path, which passes the command with the reference clock and the bypass command information instead of the high speed clock signal and the command through datapath 260. The slower clock is still sufficient to drive the necessary command signal patterns to DRAM 220, allowing system 200 to wake up DRAM 220 and PHY 230 in parallel.

It will be understood that system 200 is one implementation, and other implementations can be applied to the logic circuitry. For example, different high speed circuit architectures may not use LVRs or DLLs or other circuits components. Some designs may also choose to power gate the main transmitter (TX 268) while using a secondary, always on transmitter for the bypass path. Still other designs could implement a very fast wakeup for just TX 268. Another version could move the transmitter bypass to the phase interpolator (phase adjust 238) and override Clk3 to the low speed clock.

High speed 10 (input/output) designs use precision analog circuits such as PLL, DLLs, phase interpolators, transceivers, and analog LVR that take time to wake up and stabilize. It will be understood that minimizing the wakeup time while maintaining low active power and high performance is even more difficult. In one example, system 200 represents a system in which the circuits, such as PLL 234, DLL 236, phase adjust 238, TX 268, and LVR 250 are architected for fast wake up. Even with fast power up, there are limits to how fast the components of PHY 230 can power up.

For example, power gate and LVR ramp rates are limited by the input rail Imax (maximum current), ESD (electrostatic discharge) protection, self-heat reliability, and overhead power. Imax and overhead power limit how much current can be drawn, limiting how quickly some components can stabilize. ESD protection can be triggered by high surges in voltage in the system, which means wakeup of the components of PHY 230 should be managed to avoid triggering an ESD response. Self-heat reliability refers to component instability due to heating up due to power usage. Component heat characteristics can be designed to allow tradeoffs in wakeup time versus overall power and performance goals.

As another example of limits on wakeup time, feedback loops such as PLLs, DLLs, and LVRs must be stable to function properly. The need for stability limits the maximum bandwidth of the components, and thus limits their wakeup time without burning excessive power. As another example of limits on wakeup time, dependencies between circuit components create serial flows that need time to execute. For example, there is a flow: power on→PLL lock→DLL lock, where the DLL cannot lock until the PLL locks, and the PLL cannot lock until stable power is provided. As another example of limits on wakeup time, on die communication delays and handshakes between components can limit how quickly they can power up.

In a traditional PHY circuit, the use of the high speed clock components (such as PLLs and DLLs) are needed to send an SRX command to the DRAM. The bypass path (the think line from power management 240 to bypass 266) enables PHY 230 to use a reference clock and ungated rails to send the SRX command to wake up DRAM 220 with lower frequency signaling. System 200 can parallelize some of the wakeup time by sending the SRX signal and then waking the components of PHY 230. Alternatively, system 200 can begin to wake up the high speed clock components of PHY 230 and then send the SRX command with low frequency signaling before the high speed clock path is fully powered up.

In one example, a validation model can be modified for the parallel wakeup flow. The parallel wakeup could be considered to violate a DFI specification, which would require specialized validation handling. One change can be to change responsibility for exiting self-refresh from the physical layer to the memory controller layer.

A system in accordance with an example of system 200 can see significant power savings when the memory is in self-refresh. A plot of power versus bandwidth for the system will show a significant curve slope change once self-refresh is achieved. In one example, the curve slope change will be at least 5×. Thus, the slope of the plot (the curve) of power versus bandwidth in operation is expected to be at least 5 times smaller than the curve of power versus bandwidth when the device is in self-refresh. Even with the significant power savings, the device should have a self-refresh exit latency that is comparable to other memory devices.

Figure 3:
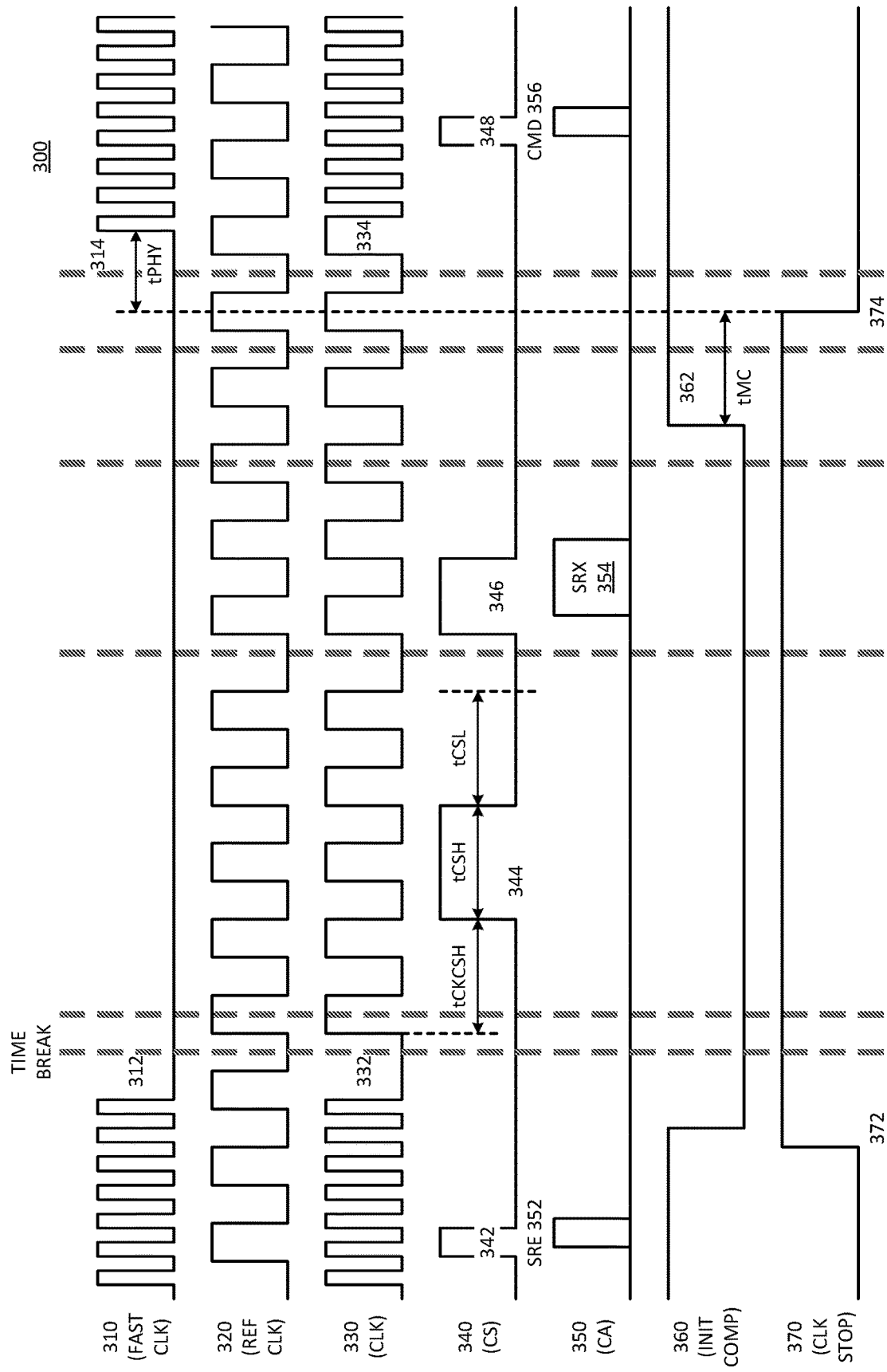
FIG. 3 is a timing diagram of an example of waking a memory device from self-refresh.

FIG. 3 is a timing diagram of an example of waking a memory device from self-refresh. Diagram 300 represents various signals for a system with a low power state for the host physical interface when the memory device is in self-refresh. Diagram 300 provides an example of a timing diagram for a system in accordance with system 100 or system 200 as well as the relevant specifications for memory 150.

In general for diagram 300, time moves from left to right. Thus, the signals at the left of the diagram are considered to happen prior to the signals at the right of the diagram. The dashed vertical lines that cut through all signals represent time breaks. Various reference numbers identify points in time for various signals, as described below. The specific timing and even relative sizing of the signals is not necessarily to scale. The difference in the fast clock and the slow or reference clock can be different (either more or less) than what diagram 300 illustrates.

Signal 310 represents a fast clock (CLK) signal, or a high speed clock signal generated by a high speed path within physical interface logic. In one example, signal 310 is turned off at time 312, which represents a time that the high speed clock path is powered down while an associated memory device is in self-refresh.

Signal 320 represents a reference clock (CLK) signal, or a reference clock that is slower than the high speed clock signal. Signal 320 represents a clock signal that does not turn off when the PHY enters a low power state and the high speed clock signal is turned off.

Signal 330 represents a transmit clock (CLK) signal, or a signal used to transmit commands and address information to the memory device. It will be observed that signal 330 can be switched between being the high speed clock of signal 310 or the lower speed clock of signal 320. Time 332 represents a transition from the high speed clock to the low speed clock. In one example, there is no delay in signal 330, but it simply transitions from high speed to low speed at time 332. In one example, there is a delay in the transition. In one example, at time 334, signal 330 transitions back from low speed to high speed.

Signal 340 represents a chip select (CS) signal to control commands sent to memory devices. Memory devices are typically connected in parallel with other memory devices, connected to the memory controller. The memory devices have unique data (DQ) signal lines, and shared command and address (CA) signal lines. The CS signal line is shared by all parallel memory devices that will execute a command in parallel (e.g., a rank). Signal 350 represents the command and address (CA) signal. Signal 360 represents an initialization complete (INIT COMP) or a ready status of the high speed clock circuitry. Signal 370 represents a clock stop (CLK STOP) signal to stop the high speed clock signal. There may be a delay between a transition of signal 370 and the stopping or starting of signal 310.

In one example, at time 342, the memory controller asserts signal 340 and sends the command SRE 352. Memory devices selected by signal 340 will execute SRE 352 and enter self-refresh. In one example, in response to self-refresh, the memory controller power management triggers a clock stop transition on signal 370 at time 372. The clock stop transition can result in signal 360 transitioning, and signal 310 stopping at time 312. Transmit clock signal can transition from high speed to low speed in signal 330 at time 332. In one example, the slow clock is only initiated or transmitted on signal 330 when the memory controller wants to drive a command to wake the memory device from self-refresh. The signal can be idle until that time.

After a time break, signal 330 provides the reference clock. After a determination to wake the memory device from self-refresh, the memory controller can toggle CS signal 340. There can be a delay of tCKCSH (delay between starting the slow clock and when a chip select rising edge can occur) between the clock transition and the CS signal assertion at time 344.

In one example, a power management block asserts the signal 340 fora time of tCSH (hold time of the CS signal at a logic one) and deassert the CS signal for at least tCSL (hold time of the CS signal at a logic zero). It will be understood that at time 344, the clock of signal 330 is in the slow clock domain, and the hold times for signal 340 can be based on signal 330.

In one example, after some delay or after no delay other than tCSL, the power management block can toggle the CS signal of signal 340 at time 346, and send a self-refresh exit command SRX 354 on signal 350. It will be understood that SRX 354 is in the slow clock domain, and the timing can be different than the signal for SRE 352 in the fast clock domain, while still maintaining a legal SRX sequence required by the memory. While not necessarily to scale, diagram 300 illustrates the longer time associated with SRX 354.

After a time break or time delay, the power management logic can assert signal 360 at time 362 to power up the memory controller. After a delay of at least tMC (memory controller power up time), the power management logic can deassert signal 370 at time 374, to initiate the high speed clock. After a delay of tPHY (the physical clock power up time), the high speed clock components will be powered up and in a stable state. Thus, after a delay of at least tPHY, the high speed clock starts as seen in signal 310 at time 314.

At time 334, signal 330 can transition from the lower speed reference clock to the high speed clock. At time 348, the memory controller can assert signal 340 to trigger a CS selection and send a command (CMD) 356 on signal 350. CMD 356 can be any access command send subsequent to the SRX command. The subsequent command is issued in the fast clock domain. Thus, diagram 300 illustrates that the PHY can wake up the memory device at one frequency of operation and after a part or after all of the PHY wakeup process, the memory controller will switch to a higher frequency for command signaling to the memory device. In one example, the memory device manages refresh operations while in self-refresh, and the memory controller manages refresh of the memory device after the command SRX 354.

Figure 4:
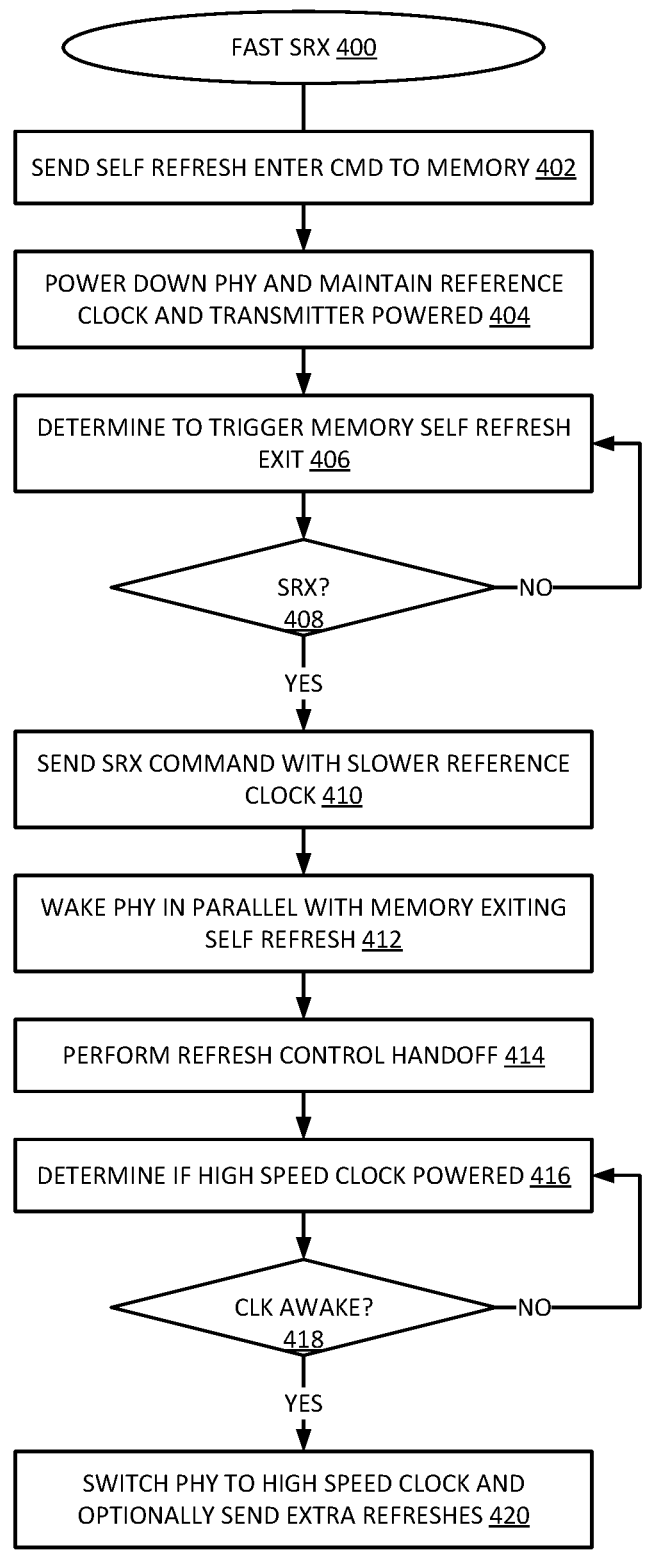
FIG. 4 is a flow diagram of an example of a process for fast exit from self-refresh with powering up the memory interface in parallel.

FIG. 4 is a flow diagram of an example of a process for fast exit from self-refresh with powering up the memory interface in parallel. Process 400 represents a process for fast self-refresh exit (SRX), which can be executed by a system in accordance with an example of system 100 or an example of system 200.

In one example, a memory controller sends a self-refresh enter command (CMD) through a transmitter to a memory, at 402. In response to the command, the memory enters self-refresh. In one example, the memory controller powers down a physical interface (PHY) and maintains a reference clock and a transmitter or transmit driver powered, at 404.

The memory controller can determine whether to trigger the memory for self-refresh exit, at 406. While the memory controller determines not to trigger SRX, at 408 NO branch, the memory controller can periodically make the determination whether to trigger SRX, at 406. When the memory controller decides to trigger SRX, at 408 YES branch, in one example, the memory controller sends an SRX command with a slower reference clock, at 410.

The memory controller, through a transmitter, sends the SRX command at the slower clock frequency because the PHY is powered down. The reference clock and transmitter are still powered up, and they can provide a bypass command path while the rest of the PHY is powered down. The memory controller can wake the PHY in parallel with the memory exiting self-refresh, at 412. In one example, the parallel waking of the memory and the PHY occurs in response to commands or signals within the PHY to wake the high speed clock components. The signals can be generated after sending the SRX command. The signals can alternatively be generated prior to sending the SRX command, but then the memory controller sends the SRX command without waiting for the high speed clock path to be powered up and ready. Rather, the memory controller sends the SRX command with a slower clock and allows the memory to wake while the PHY is powered up and stabilized.

In one example, the memory and memory controller perform a refresh control handoff, at 414. If the refresh control handoff occurs prior to the memory controller being awake, in one example, the agent executing on the host processor can track refresh timing. In one example, the memory controller initiates a timer to track refresh timing.

The memory controller can determine if the high speed clock is powered up, at 416. If the high speed clock (CLK) is not powered up, at 418 NO branch, the memory controller continues to monitor for the high speed clock powering up, at 416. When the high speed clock (CLK) is awake, at 418 YES branch, in one example, the memory controller switches from the lower speed clock to the high speed clock, at 420. The memory controller can optionally send extra refreshes to the memory as it comes out of refresh, at 420. The number of extra refresh commands can be based on a timer or counter, or it can be set by standard or by convention. Typically, the number of extra refresh commands would be a fraction of a refresh command, which can be referred to as a fractional command.

Figure 5:
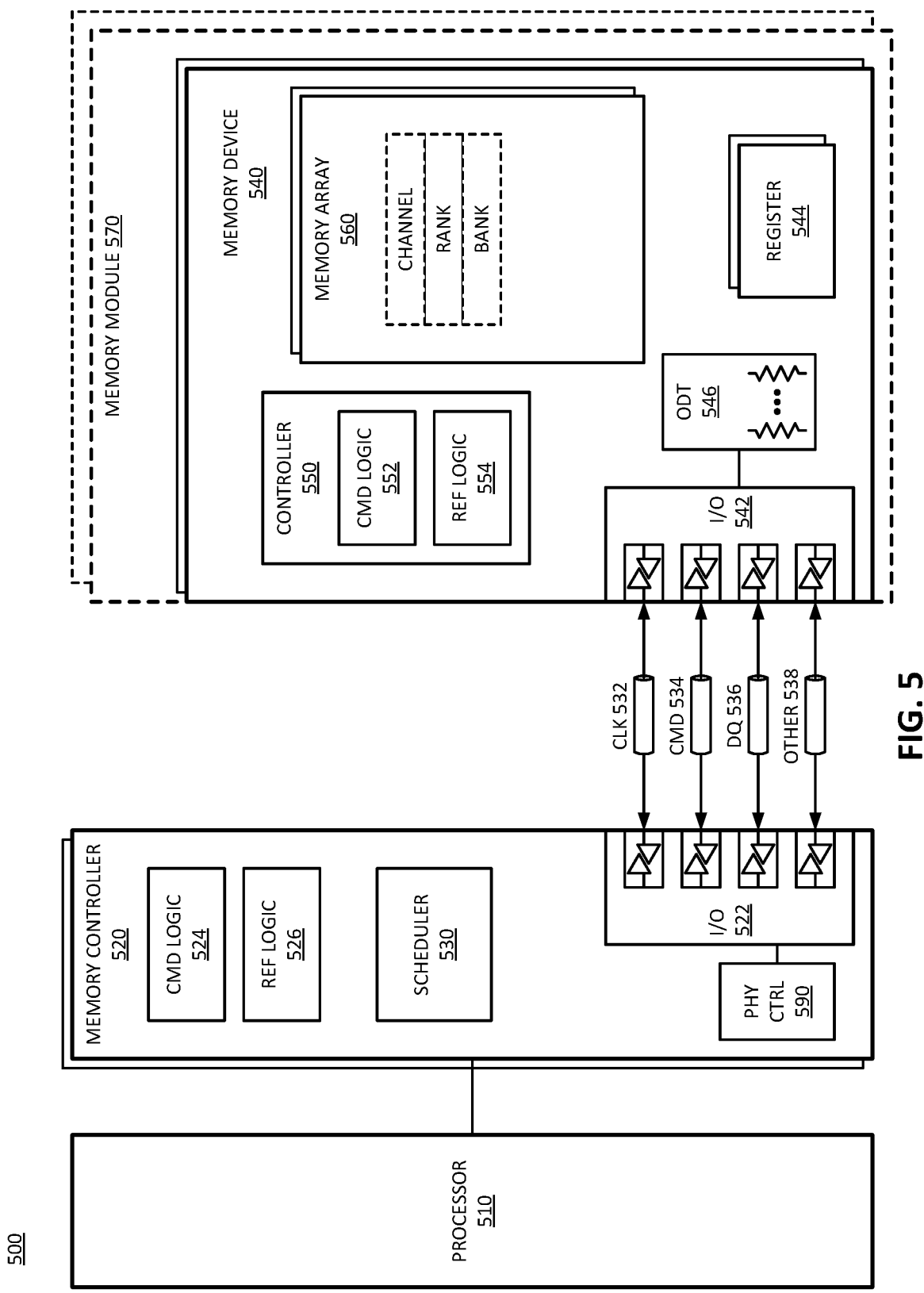
FIG. 5 is a block diagram of an example of a memory subsystem in which memory interface power-up in parallel with fast exit from self-refresh can be implemented.

FIG. 5 is a block diagram of an example of a memory subsystem in which memory interface power-up in parallel with fast exit from self-refresh can be implemented. System 500 includes a processor and elements of a memory subsystem in a computing device. System 500 represents a system with a memory subsystem in accordance with an example of system 100 or an example of system 200.

In one example, system 500 includes PHY control (CTRL) 590 in memory controller 520. PHY control 590 manages the physical interface between memory controller 520 and memory device 540. PHY control 590 can select between a slower speed reference clock and a higher speed clock generated in a high speed clock path for the interface with CMD 534. The high speed clock can be powered down and powered back up in accordance with any example herein. PHY control 590 can send an SRX command to memory device 540 with a slower clock while the PHY is powered down, and then power up the PHY in parallel with memory device 540 exiting self-refresh.

Processor 510 represents a processing unit of a computing platform that may execute an operating system (OS) and applications, which can collectively be referred to as the host or the user of the memory. The OS and applications execute operations that result in memory accesses. Processor 510 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 500 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 (HBM version 2, JESD235C, originally published by JEDEC in January 2020), HBM3 (HBM version 3 currently in discussion by JEDEC), or others or combinations of memory technologies, and technologies based on derivatives or extensions of such specifications.

Memory controller 520 represents one or more memory controller circuits or devices for system 500. In one example, memory controller 520 is on the same semiconductor substrate as processor 510. Memory controller 520 represents control logic that generates memory access commands in response to the execution of operations by processor 510. Memory controller 520 accesses one or more memory devices 540. Memory devices 540 can be DRAM devices in accordance with any referred to above. In one example, memory devices 540 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 520 manages a separate memory channel, although system 500 can be configured to have multiple channels managed by a single controller, or to have multiple controllers on a single channel. In one example, memory controller 520 is part of host processor 510, such as logic implemented on the same die or implemented in the same package space as the processor.

Memory controller 520 includes I/O interface logic 522 to couple to a memory bus, such as a memory channel as referred to above. I/O interface logic 522 (as well as I/O interface logic 542 of memory device 540) can include pins, pads, connectors, signal lines, traces, or wires, or other hardware to connect the devices, or a combination of these. I/O interface logic 522 can include a hardware interface. As illustrated, I/O interface logic 522 includes at least drivers/transceivers for signal lines. Commonly, wires within an integrated circuit interface couple with a pad, pin, or connector to interface signal lines or traces or other wires between devices. I/O interface logic 522 can include drivers, receivers, transceivers, or termination, or other circuitry or combinations of circuitry to exchange signals on the signal lines between the devices. The exchange of signals includes at least one of transmit or receive. While shown as coupling I/O 522 from memory controller 520 to I/O 542 of memory device 540, it will be understood that in an implementation of system 500 where groups of memory devices 540 are accessed in parallel, multiple memory devices can include I/O interfaces to the same interface of memory controller 520. In an implementation of system 500 including one or more memory modules 570, I/O 542 can include interface hardware of the memory module in addition to interface hardware on the memory device itself. Other memory controllers 520 will include separate interfaces to other memory devices 540.

The bus between memory controller 520 and memory devices 540 can be implemented as multiple signal lines coupling memory controller 520 to memory devices 540. The bus may typically include at least clock (CLK) 532, command/address (CMD) 534, data (DQ) 536, and zero or more other signal lines 538. In one example, a bus or connection between memory controller 520 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 500 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 520 and memory devices 540. An example of a serial bus technology is 8B10B encoding and transmission of high-speed data with embedded clock over a single differential pair of signals in each direction. In one example, CMD 534 represents signal lines shared in parallel with multiple memory devices. In one example, multiple memory devices share encoding command signal lines of CMD 534, and each has a separate chip select (CS_n) signal line to select individual memory devices.

It will be understood that in the example of system 500, the bus between memory controller 520 and memory devices 540 includes a subsidiary command bus CMD 534 and a subsidiary bus to carry the write and read data, DQ 536. In one example, the data bus can include bidirectional lines for read data and for write/command data. In another example, the subsidiary bus DQ 536 can include unidirectional write signal lines for write and data from the host to memory, and can include unidirectional lines for read data from the memory to the host. In accordance with the chosen memory technology and system design, other signals 538 may accompany a bus or sub bus, such as strobe lines DQS. Based on design of system 500, or implementation if a design supports multiple implementations, the data bus can have more or less bandwidth per memory device 540. For example, the data bus can support memory devices that have either a x4 interface, a x8 interface, a x16 interface, or other interface. The convention "xW," where W is an integer that refers to an interface size or width of the interface of memory device 540, which represents a number of signal lines to exchange data with memory controller 520. The interface size of the memory devices is a controlling factor on how many memory devices can be used concurrently per channel in system 500 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 540 and memory controller 520 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 540 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 540 represent memory resources for system 500. In one example, each memory device 540 is a separate memory die. In one example, each memory device 540 can interface with multiple (e.g., 2) channels per device or die. Each memory device 540 includes I/O interface logic 542, which has a bandwidth determined by the implementation of the device (e.g., x16 or x8 or some other interface bandwidth). I/O interface logic 542 enables the memory devices to interface with memory controller 520. I/O interface logic 542 can include a hardware interface, and can be in accordance with I/O 522 of memory controller, but at the memory device end. In one example, multiple memory devices 540 are connected in parallel to the same command and data buses. In another example, multiple memory devices 540 are connected in parallel to the same command bus, and are connected to different data buses. For example, system 500 can be configured with multiple memory devices 540 coupled in parallel, with each memory device responding to a command, and accessing memory resources 560 internal to each. For a Write operation, an individual memory device 540 can write a portion of the overall data word, and for a Read operation, an individual memory device 540 can fetch a portion of the overall data word. The remaining bits of the word will be provided or received by other memory devices in parallel.

In one example, memory devices 540 are disposed directly on a motherboard or host system platform (e.g., a PCB (printed circuit board) or substrate on which processor 510 is disposed) of a computing device. In one example, memory devices 540 can be organized into memory modules 570. In one example, memory modules 570 represent dual inline memory modules (DIMMs). In one example, memory modules 570 represent other organization of multiple memory devices to share at least a portion of access or control circuitry, which can be a separate circuit, a separate device, or a separate board from the host system platform. Memory modules 570 can include multiple memory devices 540, and the memory modules can include support for multiple separate channels to the included memory devices disposed on them. In another example, memory devices 540 may be incorporated into the same package as memory controller 520, such as by techniques such as multi-chip-module (MCM), package-on-package, through-silicon via (TSV), or other techniques or combinations. Similarly, in one example, multiple memory devices 540 may be incorporated into memory modules 570, which themselves may be incorporated into the same package as memory controller 520. It will be appreciated that for these and other implementations, memory controller 520 may be part of host processor 510.

Memory devices 540 each include one or more memory arrays 560. Memory array 560 represents addressable memory locations or storage locations for data. Typically, memory array 560 is managed as rows of data, accessed via wordline (rows) and bitline (individual bits within a row) control. Memory array 560 can be organized as separate channels, ranks, and banks of memory. Channels may refer to independent control paths to storage locations within memory devices 540. Ranks may refer to common locations across multiple memory devices (e.g., same row addresses within different devices) in parallel. Banks may refer to sub-arrays of memory locations within a memory device 540. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 540 include one or more registers 544. Register 544 represents one or more storage devices or storage locations that provide configuration or settings for the operation of the memory device. In one example, register 544 can provide a storage location for memory device 540 to store data for access by memory controller 520 as part of a control or management operation. In one example, register 544 includes one or more Mode Registers. In one example, register 544 includes one or more multipurpose registers. The configuration of locations within register 544 can configure memory device 540 to operate in different "modes," where command information can trigger different operations within memory device 540 based on the mode. Additionally or in the alternative, different modes can also trigger different operation from address information or other signal lines depending on the mode. Settings of register 544 can indicate configuration for I/O settings (e.g., timing, termination or ODT (on-die termination) 546, driver configuration, or other I/O settings).

In one example, memory device 540 includes ODT 546 as part of the interface hardware associated with I/O 542. ODT 546 can be configured as mentioned above, and provide settings for impedance to be applied to the interface to specified signal lines. In one example, ODT 546 is applied to DQ signal lines. In one example, ODT 546 is applied to command signal lines. In one example, ODT 546 is applied to address signal lines. In one example, ODT 546 can be applied to any combination of the preceding. The ODT settings can be changed based on whether a memory device is a selected target of an access operation or a non-target device. ODT 546 settings can affect the timing and reflections of signaling on the terminated lines. Careful control over ODT 546 can enable higher-speed operation with improved matching of applied impedance and loading. ODT 546 can be applied to specific signal lines of I/O interface 542, 522 (for example, ODT for DQ lines or ODT for CA lines), and is not necessarily applied to all signal lines.

Memory device 540 includes controller 550, which represents control logic within the memory device to control internal operations within the memory device. For example, controller 550 decodes commands sent by memory controller 520 and generates internal operations to execute or satisfy the commands. Controller 550 can be referred to as an internal controller, and is separate from memory controller 520 of the host. Controller 550 can determine what mode is selected based on register 544, and configure the internal execution of operations for access to memory resources 560 or other operations based on the selected mode. Controller 550 generates control signals to control the routing of bits within memory device 540 to provide a proper interface for the selected mode and direct a command to the proper memory locations or addresses. Controller 550 includes command logic 552, which can decode command encoding received on command and address signal lines. Thus, command logic 552 can be or include a command decoder. With command logic 552, memory device can identify commands and generate internal operations to execute requested commands.

Referring again to memory controller 520, memory controller 520 includes command (CMD) logic 524, which represents logic or circuitry to generate commands to send to memory devices 540. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 540, memory controller 520 can issue commands via I/O 522 to cause memory device 540 to execute the commands. In one example, controller 550 of memory device 540 receives and decodes command and address information received via I/O 542 from memory controller 520. Based on the received command and address information, controller 550 can control the timing of operations of the logic and circuitry within memory device 540 to execute the commands. Controller 550 is responsible for compliance with standards or specifications within memory device 540, such as timing and signaling requirements. Memory controller 520 can implement compliance with standards or specifications by access scheduling and control.

Memory controller 520 includes scheduler 530, which represents logic or circuitry to generate and order transactions to send to memory device 540. From one perspective, the primary function of memory controller 520 could be said to schedule memory access and other transactions to memory device 540. Such scheduling can include generating the transactions themselves to implement the requests for data by processor 510 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 520 typically includes logic such as scheduler 530 to allow selection and ordering of transactions to improve performance of system 500. Thus, memory controller 520 can select which of the outstanding transactions should be sent to memory device 540 in which order, which is typically achieved with logic much more complex that a simple first-in first-out algorithm. Memory controller 520 manages the transmission of the transactions to memory device 540, and manages the timing associated with the transaction. In one example, transactions have deterministic timing, which can be managed by memory controller 520 and used in determining how to schedule the transactions with scheduler 530.

In one example, memory controller 520 includes refresh (REF) logic 526. Refresh logic 526 can be used for memory resources that are volatile and need to be refreshed to retain a deterministic state. In one example, refresh logic 526 indicates a location for refresh, and a type of refresh to perform. Refresh logic 526 can trigger self-refresh within memory device 540, or execute external refreshes which can be referred to as auto refresh commands) by sending refresh commands, or a combination. In one example, controller 550 within memory device 540 includes refresh logic 554 to apply refresh within memory device 540. In one example, refresh logic 554 generates internal operations to perform refresh in accordance with an external refresh received from memory controller 520. Refresh logic 554 can determine if a refresh is directed to memory device 540, and what memory resources 560 to refresh in response to the command.

Figure 6:
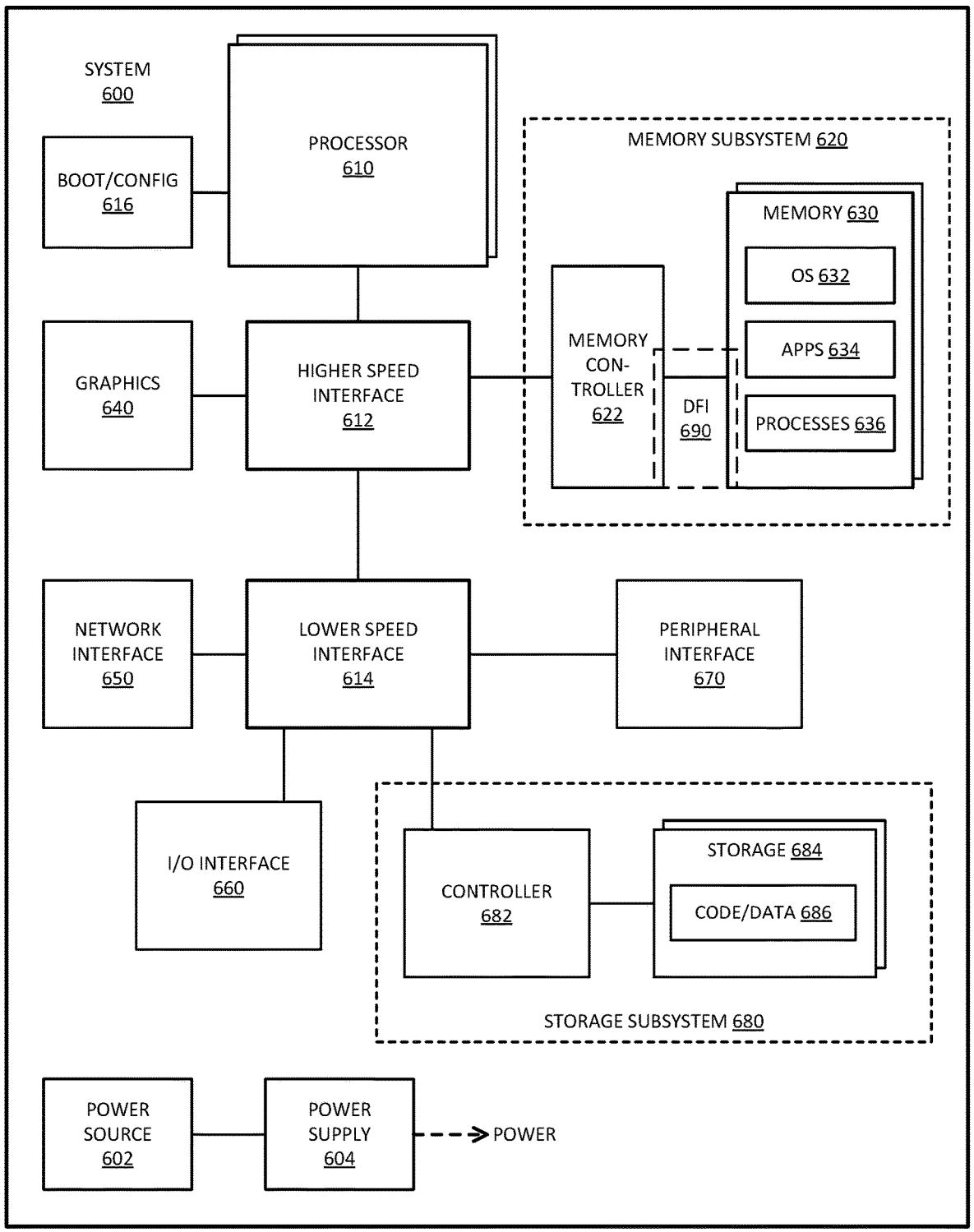
FIG. 6 is a block diagram of an example of a computing system in which memory interface power-up in parallel with fast exit from self-refresh can be implemented.

FIG. 6 is a block diagram of an example of a computing system in which memory interface power-up in parallel with fast exit from self-refresh can be implemented. System 600 represents a computing device in accordance with any example herein, and can be a laptop computer, a desktop computer, a tablet computer, a server, a gaming or entertainment control system, embedded computing device, or other electronic device. System 600 represents a system with a memory subsystem in accordance with an example of system 100 or an example of system 200.

In one example, system 600 includes DFI (DDR physical interface) 690 to couple memory controller 622 with memory 630. DFI 690 represents the physical interface logic between memory controller 622 and memory 630. DFI 690 can select between a slower speed reference clock and a higher speed clock generated in a high speed clock path for the interface. The high speed clock can be powered down and powered back up in accordance with any example herein. DFI 690 can send an SRX command to memory 630 with a slower clock while the PHY is powered down, and then power up the PHY in parallel with memory 630 exiting self-refresh.

System 600 includes processor 610 can include any type of microprocessor, central processing unit (CPU), graphics processing unit (GPU), processing core, or other processing hardware, processor device, or a combination, to provide processing or execution of instructions for system 600. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or a combination of such devices. Processor 610 can be considered a host processor device for system 600.

System 600 includes boot/config 616, which represents storage to store boot code (e.g., basic input/output system (BIOS)), configuration settings, security hardware (e.g., trusted platform module (TPM)), or other system level hardware that operates outside of a host OS. Boot/config 616 can include a nonvolatile storage device, such as read-only memory (ROM), flash memory, or other memory devices.

In one example, system 600 includes interface 612 coupled to processor 610, which can represent a higher speed interface or a high throughput interface for system components that need higher bandwidth connections, such as memory subsystem 620 or graphics interface components 640. Interface 612 represents an interface circuit, which can be a standalone component or integrated onto a processor die. Interface 612 can be integrated as a circuit onto the processor die or integrated as a component on a system on a chip. Where present, graphics interface 640 interfaces to graphics components for providing a visual display to a user of system 600. Graphics interface 640 can be a standalone component or integrated onto the processor die or system on a chip. In one example, graphics interface 640 can drive a high definition (HD) display or ultra high definition (UHD) display that provides an output to a user. In one example, the display can include a touchscreen display. In one example, graphics interface 640 generates a display based on data stored in memory 630 or based on operations executed by processor 610 or both.

Memory subsystem 620 represents the main memory of system 600, and provides storage for code to be executed by processor 610, or data values to be used in executing a routine. Memory subsystem 620 can include one or more memory devices 630 such as read-only memory (ROM), flash memory, one or more varieties of random access memory (RAM) such as DRAM, 3DXP (three-dimensional crosspoint), or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610, such as integrated onto the processor die or a system on a chip.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 600 includes interface 614, which can be coupled to interface 612. Interface 614 can be a lower speed interface than interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can exchange data with a remote device, which can include sending data stored in memory or receiving data to be stored in memory.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, 3DXP, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one example, storage subsystem 680 includes controller 682 to interface with storage 684. In one example controller 682 is a physical part of interface 614 or processor 610, or can include circuits or logic in both processor 610 and interface 614.

Power source 602 provides power to the components of system 600. More specifically, power source 602 typically interfaces to one or multiple power supplies 604 in system 600 to provide power to the components of system 600. In one example, power supply 604 includes an AC to DC (alternating current to direct current) adapter to plug into a wall outlet. Such AC power can be renewable energy (e.g., solar power) power source 602. In one example, power source 602 includes a DC power source, such as an external AC to DC converter. In one example, power source 602 or power supply 604 includes wireless charging hardware to charge via proximity to a charging field. In one example, power source 602 can include an internal battery or fuel cell source.

Figure 7:
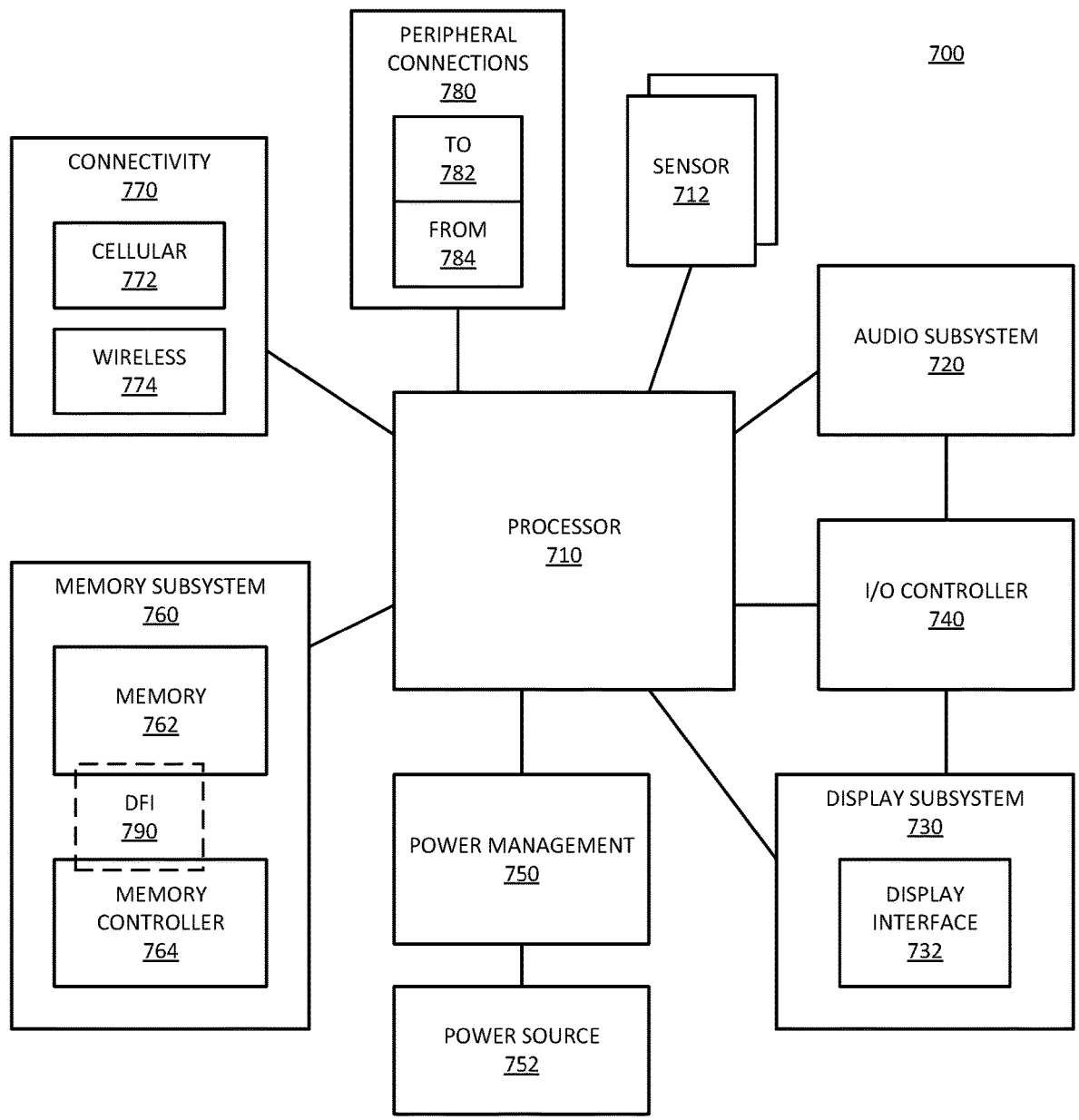
FIG. 7 is a block diagram of an example of a mobile device in which memory interface power-up in parallel with fast exit from self-refresh can be implemented.

FIG. 7 is a block diagram of an example of a mobile device in which memory interface power-up in parallel with fast exit from self-refresh can be implemented. System 700 represents a mobile computing device, such as a computing tablet, a mobile phone or smartphone, wearable computing device, or other mobile device, or an embedded computing device. It will be understood that certain of the components are shown generally, and not all components of such a device are shown in system 700.

In one example, system 700 includes DFI (DDR physical interface) 790 to couple memory controller 764 with memory 762. DFI 790 represents the physical interface logic between memory controller 764 and memory 762. DFI 790 can select between a slower speed reference clock and a higher speed clock generated in a high speed clock path for the interface. The high speed clock can be powered down and powered back up in accordance with any example herein. DFI 790 can send an SRX command to memory 762 with a slower clock while the PHY is powered down, and then power up the PHY in parallel with memory 762 exiting self-refresh.

System 700 includes processor 710, which performs the primary processing operations of system 700. Processor 710 can include one or more physical devices, such as microprocessors, application processors, microcontrollers, programmable logic devices, or other processing means or processor devices. Processor 710 can be considered a host processor device for system 700. The processing operations performed by processor 710 include the execution of an operating platform or operating system on which applications and device functions are executed. The processing operations include operations related to I/O (input/output) with a human user or with other devices, operations related to power management, operations related to connecting system 700 to another device, or a combination. The processing operations can also include operations related to audio I/O, display I/O, or other interfacing, or a combination. Processor 710 can execute data stored in memory. Processor 710 can write or edit data stored in memory.

In one example, system 700 includes one or more sensors 712. Sensors 712 represent embedded sensors or interfaces to external sensors, or a combination. Sensors 712 enable system 700 to monitor or detect one or more conditions of an environment or a device in which system 700 is implemented. Sensors 712 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 712 can also include sensors for biometric systems such as fingerprint recognition systems, face detection or recognition systems, or other systems that detect or recognize user features. Sensors 712 should be understood broadly, and not limiting on the many different types of sensors that could be implemented with system 700. In one example, one or more sensors 712 couples to processor 710 via a frontend circuit integrated with processor 710. In one example, one or more sensors 712 couples to processor 710 via another component of system 700.

In one example, system 700 includes audio subsystem 720, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 700, or connected to system 700. In one example, a user interacts with system 700 by providing audio commands that are received and processed by processor 710.

Display subsystem 730 represents hardware (e.g., display devices) and software components (e.g., drivers) that provide a visual display for presentation to a user. In one example, the display includes tactile components or touchscreen elements for a user to interact with the computing device. Display subsystem 730 includes display interface 732, which includes the particular screen or hardware device used to provide a display to a user. In one example, display interface 732 includes logic separate from processor 710 (such as a graphics processor) to perform at least some processing related to the display. In one example, display subsystem 730 includes a touchscreen device that provides both output and input to a user. In one example, display subsystem 730 includes a high definition (HD) or ultra-high definition (UHD) display that provides an output to a user. In one example, display subsystem includes or drives a touchscreen display. In one example, display subsystem 730 generates display information based on data stored in memory or based on operations executed by processor 710 or both.

I/O controller 740 represents hardware devices and software components related to interaction with a user. I/O controller 740 can operate to manage hardware that is part of audio subsystem 720, or display subsystem 730, or both. Additionally, I/O controller 740 illustrates a connection point for additional devices that connect to system 700 through which a user might interact with the system. For example, devices that can be attached to system 700 might include microphone devices, speaker or stereo systems, video systems or other display device, keyboard or keypad devices, buttons/switches, or other I/O devices for use with specific applications such as card readers or other devices.

As mentioned above, I/O controller 740 can interact with audio subsystem 720 or display subsystem 730 or both. For example, input through a microphone or other audio device can provide input or commands for one or more applications or functions of system 700. Additionally, audio output can be provided instead of or in addition to display output. In another example, if display subsystem includes a touchscreen, the display device also acts as an input device, which can be at least partially managed by I/O controller 740. There can also be additional buttons or switches on system 700 to provide I/O functions managed by I/O controller 740.

In one example, I/O controller 740 manages devices such as accelerometers, cameras, light sensors or other environmental sensors, gyroscopes, global positioning system (GPS), or other hardware that can be included in system 700, or sensors 712. The input can be part of direct user interaction, as well as providing environmental input to the system to influence its operations (such as filtering for noise, adjusting displays for brightness detection, applying a flash for a camera, or other features).

In one example, system 700 includes power management 750 that manages battery power usage, charging of the battery, and features related to power saving operation. Power management 750 manages power from power source 752, which provides power to the components of system 700. In one example, power source 752 includes an AC to DC (alternating current to direct current) adapter to plug into a wall outlet. Such AC power can be renewable energy (e.g., solar power, motion based power). In one example, power source 752 includes only DC power, which can be provided by a DC power source, such as an external AC to DC converter. In one example, power source 752 includes wireless charging hardware to charge via proximity to a charging field. In one example, power source 752 can include an internal battery or fuel cell source.

Memory subsystem 760 includes memory device(s) 762 for storing information in system 700. Memory subsystem 760 can include nonvolatile (state does not change if power to the memory device is interrupted) or volatile (state is indeterminate if power to the memory device is interrupted) memory devices, or a combination. Memory 760 can store application data, user data, music, photos, documents, or other data, as well as system data (whether long-term or temporary) related to the execution of the applications and functions of system 700. In one example, memory subsystem 760 includes memory controller 764 (which could also be considered part of the control of system 700, and could potentially be considered part of processor 710). Memory controller 764 includes a scheduler to generate and issue commands to control access to memory device 762.

Connectivity 770 includes hardware devices (e.g., wireless or wired connectors and communication hardware, or a combination of wired and wireless hardware) and software components (e.g., drivers, protocol stacks) to enable system 700 to communicate with external devices. The external device could be separate devices, such as other computing devices, wireless access points or base stations, as well as peripherals such as headsets, printers, or other devices. In one example, system 700 exchanges data with an external device for storage in memory or for display on a display device. The exchanged data can include data to be stored in memory, or data already stored in memory, to read, write, or edit data.

Connectivity 770 can include multiple different types of connectivity. To generalize, system 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 774 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that system 700 could both be a peripheral device ("to" 782) to other computing devices, as well as have peripheral devices ("from" 784) connected to it. System 700 commonly has a "docking" connector to connect to other computing devices for purposes such as managing (e.g., downloading, uploading, changing, synchronizing) content on system 700. Additionally, a docking connector can allow system 700 to connect to certain peripherals that allow system 700 to control content output, for example, to audiovisual or other systems.

In addition to a proprietary docking connector or other proprietary connection hardware, system 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory controller includes: a high speed clock path of a physical interface (PHY) to a memory device, the high speed clock path including frequency and phase hardware to generate a high speed clock signal, wherein the high speed clock path is to be powered down when the memory device is in self-refresh; a reference clock path of the PHY to bypass the high speed clock path with a reference clock separate from the high speed clock signal; and a transmitter of the PHY to drive a self-refresh exit (SRX) command to the memory device based on the reference clock to trigger the memory device to exit from self-refresh; wherein the high speed clock path is to initiate power up in conjunction with the SRX command triggering the memory device to exit from self-refresh; and wherein the transmitter is to transmit a subsequent command to the memory device based on the high speed clock after the high speed clock path is powered up.

In one example of the memory controller, the high speed clock path includes a phase locked loop (PLL), a delay locked loop (DLL), or a frequency locked loop. In accordance with any preceding example of the memory controller, in one example, when the memory device is in self-refresh, the memory device is to manage refresh of the memory device, and in response to the SRX command, the memory controller is to manage refresh of the memory device. In accordance with any preceding example of the memory controller, in one example, the transmitter is to send extra refresh commands or fractional commands after the high speed clock path is powered up. In accordance with any preceding example of the memory controller, in one example, the reference clock is slower than or the same frequency as the high speed clock signal. In accordance with any preceding example of the memory controller, in one example, when the memory device is in self-refresh, the memory device is to manage refresh of the memory device, and wherein the memory controller is to manage refresh of the memory device after the transmitter drives the SRX command. In accordance with any preceding example of the memory controller, in one example, the high speed clock path is to initiate power up after the driving of the SRX command. In accordance with any preceding example of the memory controller, in one example, the memory controller includes: a high speed datapath of the PHY, wherein the high speed datapath is to be powered down when the high speed clock path is to be powered down, and to be powered up when the high speed clock path is powered up. In accordance with any preceding example of the memory controller, in one example, the PHY includes a low voltage regulator (LVR) and a power gate, wherein the LVR and power gate to be powered down when the high speed clock path is to be powered down, and to be powered up when the high speed clock path is powered up. In accordance with any preceding example of the memory controller, in one example, the memory controller includes: a selector to control selection of the reference clock or the high speed clock based on a power state of the high speed clock path or datapath. In accordance with any preceding example of the memory controller, in one example, the selector comprises a multiplexer. In accordance with any preceding example of the memory controller, in one example, the memory controller includes: a timer to track a time from transmission of the SRX command to receipt of an indication from the memory device that the memory has exited from self-refresh; wherein the memory controller is to send a number of refresh commands or fractional commands based on the time.

In general with respect to the descriptions herein, in one example a system includes: a memory device; a memory controller physical interface (PHY) coupled to the memory device, the PHY including: a high speed clock path including frequency and phase hardware to generate a high speed clock signal, wherein the high speed clock path is to be powered down when the memory device is in self-refresh; a reference clock path to bypass the high speed clock path with a reference clock slower than the high speed clock signal; and a transmitter to drive a self-refresh exit (SRX) command to the memory device based on the reference clock to trigger the memory device to exit from self-refresh; wherein the high speed clock path is to initiate power up after the driving of the SRX command; and wherein the transmitter is to transmit a subsequent command to the memory device based on the high speed clock after the high speed clock path is powered up.

In one example of the system, the high speed clock path includes a phase locked loop (PLL), a delay locked loop (DLL), or a frequency locked loop. In accordance with any preceding example of the system, in one example, when the memory device is in self-refresh, the memory device is to manage refresh of the memory device, and in response to the SRX command, the memory controller is to manage refresh of the memory device, wherein the transmitter is to send extra refresh commands after the high speed clock path is powered up. In accordance with any preceding example of the system, in one example, when the memory device is in self-refresh, the memory device is to manage refresh of the memory device, and wherein the memory controller is to manage refresh of the memory device after the transmitter drives the SRX command. In accordance with any preceding example of the system, in one example, the system includes: a high speed datapath of the PHY, wherein the high speed datapath is to be powered down when the high speed clock path is to be powered down, and to be powered up when the high speed clock path is powered up. In accordance with any preceding example of the system, in one example, the system includes: a multiplexer to control selection of the reference clock or the high speed clock based on a power state of the high speed clock path. In accordance with any preceding example of the system, in one example, the system includes: a timer to track a time from transmission of the SRX command to receipt of an indication from the memory device that the memory has exited from self-refresh; wherein the memory controller is to send a number of refresh commands based on the time. In accordance with any preceding example of the system, in one example, the system includes one or more of: a multicore host processor coupled to the memory controller; a display communicatively coupled to a host processor; a network interface communicatively coupled to a host processor; or a battery to power the system.

In general with respect to the descriptions herein, in one example a method includes: powering down a high speed clock path when a memory device is in self-refresh, the high speed clock path includes frequency and phase hardware; selecting a reference clock that bypasses the high speed clock path when the high speed clock path is powered down; transmitting a self-refresh exit (SRX) command to the memory device based on the reference clock to trigger the memory device to exit from self-refresh; powering up the high speed clock path after transmitting the SRX command; and transmitting a subsequent command to the memory device based on the high speed clock after the high speed clock path is powered up.

In one example of the method, when the memory device is in self-refresh, managing refresh of the memory device with the memory device; and in response to the SRX command, managing refresh of the memory with the memory controller, including sending extra refresh commands after the high speed clock path is powered up. In accordance with any preceding example of the method, in one example, the method includes: tracking a time from transmission of the SRX command to receipt of an indication from the memory device that the memory has exited from self-refresh; sending a number of refresh commands based on the time.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller comprising:
a high speed clock path of a physical interface (PHY) to a memory device, the high speed clock path including frequency and phase hardware to generate a high speed clock signal, wherein the high speed clock path is to be powered down when the memory device is in self-refresh;
a reference clock path of the PHY to bypass the high speed clock path with a reference clock separate from the high speed clock signal; and
a transmitter of the PHY to drive a self-refresh exit (SRX) command to the memory device based on the reference clock to trigger the memory device to exit from self-refresh;
wherein the high speed clock path is to initiate power up in conjunction with the SRX command triggering the memory device to exit from self-refresh; and
wherein the transmitter is to transmit a subsequent command to the memory device based on the high speed clock signal after the high speed clock path is powered up.

2. The memory controller of claim 1, wherein the high speed clock path includes a phase locked loop (PLL), a delay locked loop (DLL), or a frequency locked loop.

3. The memory controller of claim 1, wherein when the memory device is in self-refresh, the memory device is to manage refresh of the memory device, and in response to the SRX command, the memory controller is to manage refresh of the memory device.

4. The memory controller of claim 3, wherein the transmitter is to send extra refresh commands or fractional commands after the high speed clock path is powered up.

5. The memory controller of claim 1, wherein the reference clock is slower than or the same frequency as the high speed clock signal.

6. The memory controller of claim 1, wherein when the memory device is in self-refresh, the memory device is to manage refresh of the memory device, and wherein the memory controller is to manage refresh of the memory device after the transmitter drives the SRX command.

7. The memory controller of claim 1, wherein the high speed clock path is to initiate power up after the driving of the SRX command.

8. The memory controller of claim 1, further comprising:
a high speed datapath of the PHY, wherein the high speed datapath is to be powered down when the high speed clock path is to be powered down, and to be powered up when the high speed clock path is powered up.

9. The memory controller of claim 1, wherein the PHY includes a low voltage regulator (LVR) and a power gate, wherein the LVR and the power gate to be powered down when the high speed clock path is to be powered down, and to be powered up when the high speed clock path is powered up.

10. The memory controller of claim 1, further comprising:
a selector to control selection of the reference clock or the high speed clock signal based on a power state of the high speed clock path or datapath.

11. The memory controller of claim 10, wherein the selector comprises a multiplexer.

12. The memory controller of claim 1, further comprising:
a timer to track a time from transmission of the SRX command to receipt of an indication from the memory device that the memory device has exited from self-refresh;
wherein the memory controller is to send a number of refresh commands or fractional commands based on the time.

13. A system, comprising:
a memory device;
a memory controller physical interface (PHY) of a memory controller coupled to the memory device, the PHY including:
a high speed clock path including frequency and phase hardware to generate a high speed clock signal, wherein the high speed clock path is to be powered down when the memory device is in self-refresh;
a reference clock path to bypass the high speed clock path with a reference clock slower than the high speed clock signal; and
a transmitter to drive a self-refresh exit (SRX) command to the memory device based on the reference clock to trigger the memory device to exit from self-refresh;
wherein the high speed clock path is to initiate power up after the driving of the SRX command; and
wherein the transmitter is to transmit a subsequent command to the memory device based on the high speed clock signal after the high speed clock path is powered up.

14. The system of claim 13, wherein the high speed clock path includes a phase locked loop (PLL), a delay locked loop (DLL), or a frequency locked loop.

15. The system of claim 13, wherein when the memory device is in self-refresh, the memory device is to manage refresh of the memory device, and in response to the SRX command, the memory controller is to manage refresh of the memory device, wherein the transmitter is to send extra refresh commands after the high speed clock path is powered up.

16. The system of claim 13, wherein when the memory device is in self-refresh, the memory device is to manage refresh of the memory device, and wherein the memory controller is to manage refresh of the memory device after the transmitter drives the SRX command.

17. The system of claim 13, further comprising:
a high speed datapath of the PHY, wherein the high speed datapath is to be powered down when the high speed clock path is to be powered down, and to be powered up when the high speed clock path is powered up.

18. The system of claim 13, further comprising:
a multiplexer to control selection of the reference clock or the high speed clock signal based on a power state of the high speed clock path.

19. The system of claim 13, further comprising:
a timer to track a time from transmission of the SRX command to receipt of an indication from the memory device that the memory device has exited from self-refresh;
wherein the memory controller is to send a number of refresh commands based on the time.

20. The system of claim 13, further comprising one or more of:
a multicore host processor coupled to the memory controller;
a display communicatively coupled to a host processor;
a network interface communicatively coupled to a host processor; or
a battery to power the system.

21. A method comprising:
powering down a high speed clock path when a memory device is in self-refresh, the high speed clock path including frequency and phase hardware to generate a high speed clock signal;
selecting a reference clock that bypasses the high speed clock path when the high speed clock path is powered down;
transmitting a self-refresh exit (SRX) command to the memory device based on the reference clock to trigger the memory device to exit from self-refresh;
powering up the high speed clock path after transmitting the SRX command; and
transmitting a subsequent command to the memory device based on the high speed clock signal after the high speed clock path is powered up.

22. The method of claim 21,
wherein when the memory device is in self-refresh, managing refresh of the memory device with the memory device; and
in response to the SRX command, managing refresh of the memory device, including sending extra refresh commands after the high speed clock path is powered up.

23. The method of claim 21, further comprising:
tracking a time from transmission of the SRX command to receipt of an indication from the memory device that the memory device has exited from self-refresh;
sending a number of refresh commands based on the time.

* * * * *